United States Patent
Kim

(10) Patent No.: US 10,622,041 B2
(45) Date of Patent: Apr. 14, 2020

(54) SEMICONDUCTOR DEVICE INCLUDING CLOCK GENERATION CIRCUIT FOR WRITE WRITE LEVELING OPERATION AND WRITE OPERATION

(71) Applicant: SK hynix Inc., Gyeonggi-do (KR)

(72) Inventor: Young-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 15/968,219

(22) Filed: May 1, 2018

(65) Prior Publication Data

US 2019/0122713 A1     Apr. 25, 2019

(30) Foreign Application Priority Data

Oct. 23, 2017  (KR) .................. 10-2017-0137215

(51) Int. Cl.
| | | |
|---|---|---|
| G11C 7/00 | (2006.01) | |
| G11C 7/22 | (2006.01) | |
| G11C 7/10 | (2006.01) | |
| G11C 11/4076 | (2006.01) | |
| G11C 11/4096 | (2006.01) | |
| G11C 29/02 | (2006.01) | |

(52) U.S. Cl.
CPC ............ *G11C 7/222* (2013.01); *G11C 7/1087* (2013.01); *G11C 7/1093* (2013.01); *G11C 7/1096* (2013.01); *G11C 11/4076* (2013.01); *G11C 11/4096* (2013.01); *G11C 29/023* (2013.01); *G11C 29/028* (2013.01); *G11C 2207/107* (2013.01); *G11C 2207/2254* (2013.01)

(58) Field of Classification Search
CPC ..... G11C 7/222; G11C 7/1087; G11C 7/1093; G11C 7/1096
USPC ................... 365/193, 194, 198, 233
See application file for complete search history.

(56) References Cited

U.S. PATENT DOCUMENTS

| | | | |
|---|---|---|---|
| 9,236,101 B2 * | 1/2016 | Lee | G11C 7/222 |
| 2005/0122153 A1 * | 6/2005 | Lin | H03L 7/0814 327/291 |
| 2009/0059713 A1 * | 3/2009 | Ijitsu | G11C 29/12015 365/233.1 |
| 2013/0141994 A1 | 6/2013 | Ito et al. | |

FOREIGN PATENT DOCUMENTS

KR     1020110018750     2/2011

* cited by examiner

*Primary Examiner* — Connie C Yoha
(74) *Attorney, Agent, or Firm* — IP & T Group LLP

(57) ABSTRACT

A semiconductor device includes: a clock generation circuit suitable for generating first and second write clocks that correspond respectively to a rising clock and a falling clock of an external clock during a write leveling operation, and for generating an input clock based on a delay of a write command by a delay time based on the rising clock during a write operation; a first transmission line suitable for transmitting the first write clock or the input clock as a first transmission clock; and a second transmission line suitable for transmitting the second write clock as a second transmission clock.

23 Claims, 8 Drawing Sheets

SEMICONDUCTOR DEVICE INCLUDING CLOCK GENERATION CIRCUIT FOR WRITE WRITE LEVELING OPERATION AND WRITE OPERATION

CROSS-REFERENCE TO RELATED APPLICATIONS

This application claims priority under 35 U.S.C. § 119 to Korean Patent Application No. 10-2017-0137215, filed on Oct. 23, 2017, which is incorporated herein by reference in its entirety.

BACKGROUND

1. Field

Various exemplary embodiments of the present invention relate to a semiconductor device. Particularly, exemplary embodiments relate to a semiconductor device that performs a write leveling operation, and an operating method of the same.

2. Description of the Related Art

As the operating speed of a semiconductor system increases, a high-speed data transfer rate is required between semiconductor devices included in the semiconductor system. A prefetch operation is applied to data inputted and outputted in series between the semiconductor devices in order to satisfy a high-speed data transfer rate or a data high-bandwidth. The prefetch operation refers to latching and parallelizing each of data inputted in series. In order to parallelize the data, a clock having different phases, that is, an internal clock having multiple phases is generated in the semiconductor device to be used for data input/output.

SUMMARY

Various embodiments of the present invention are directed to a semiconductor device capable of sharing a clock generation circuit for a write operation and a write leveling operation.

Various embodiments of the present invention are directed to a semiconductor device capable of sharing a clock transmission path for a write operation and a write leveling operation.

In accordance with an embodiment of the present invention, a semiconductor device includes: a clock generation circuit suitable for generating first and second write clocks that correspond respectively to a rising clock and a falling clock of an external clock during a write leveling operation, and for generating an input clock based on a delay of a write command by a delay time based on the rising clock during a write operation; a first transmission line suitable for transmitting the first write clock or the input clock as a first transmission clock; and a second transmission line suitable for transmitting the second write clock as a second transmission clock.

In accordance with an embodiment of the present invention, an operating method of a semiconductor device includes: generating first and second write clocks that correspond respectively to a rising clock and a falling clock of an external clock and transmitting the first and second write clocks respectively to first and second transmission lines during a write leveling operation; generating a leveling control signal based on the first and second write clocks transmitted respectively to the first and second transmission lines and first and second strobe signals during the write leveling operation; generating an input clock by delaying a write command by a set time and transmitting the input clock to the first transmission line based on the rising lock during a write operation; and generating a phase information signal based on the input clock transmitted to the first transmission line and the first and second strobe signals during the write operation.

In accordance with an embodiment of the present invention, a semiconductor device includes: a clock generation circuit suitable for generating first and second clocks that correspond respectively to a rising clock and a falling clock of an external clock when a mode control signal is activated and for generating a third clock based on a delay of an input command by a set time based on the rising clock when the mode control signal is deactivated; a signal transmission block suitable for transmitting the first and third clocks as a first transmission clock and transmitting the second clock as a second transmission clock; and an internal circuit suitable for receiving the first and second transmission clocks and first and second strobe signals, generating first information on a phase difference between the external clock and the first and second strobe signals when the mode control signal is activated, and generating second information on which of the first and second strobe signals is used in advance to drive an input data when the mode control signal is deactivated.

DETAILED DESCRIPTION

Figure 1:
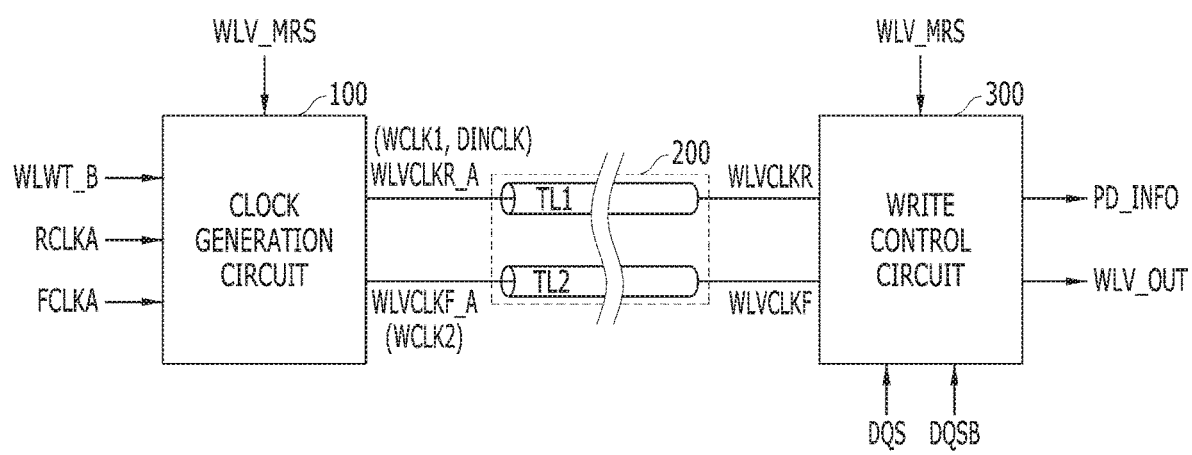
FIG. 1 is a block diagram illustrating a semiconductor device in accordance with an embodiment of the present invention.

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Transmission and reception of read data and write data between a semiconductor device such as, e.g., a Dynamic Random Access Memory (DRAM), and a controller may be performed synchronously with a data strobe signal. For example, in a write operation, a controller supplies a data strobe signal and write data to a semiconductor device, and the semiconductor device fetches the write data synchronously with the data strobe signal.

However, the write data fetched by the semiconductor device is transferred to a memory cell array synchronously with a clock signal, which is different from the data strobe signal. Therefore, when a CLK- to DQS skew exists between the data strobe signal and the clock signal, a write operation may not be performed correctly. To solve this problem, a semiconductor device may perform a write leveling operation for measuring the CLK- to DQS skew between a clock signal and a data strobe signal before performing the write operation.

In a write leveling operation, a semiconductor device samples a clock signal at a timing of a specific edge of a data strobe signal supplied from a controller, and outputs the sampled clock signal through a data pad. With this operation, the controller may acquire the amount of skew between the data strobe signal and the clock signal. Consequently, the controller may adjust an output timing of the data strobe signal by taking the acquired amount of the skew into consideration.

In general, a Low Power Double Data Rate 4 (LPDDR4) semiconductor device adopting a write leveling scheme is separately composed of a clock generation circuit for a write leveling operation and a clock generation circuit for a write operation. Therefore, various attempts have been made to maximally match clock transmission paths for transmitting clocks outputted from these two clock generation circuits. However, when a mismatch occurs between the two clock transmission paths, a CLK-to-DQS skew occurs even after a write leveling operation terminates.

Hereinafter, a method of minimizing a CLK-to-DQS skew and preventing deterioration of tDQSS characteristics is provided in accordance with one or more embodiments of the present invention.

FIG. 1 is a block diagram illustrating a semiconductor device in accordance with an embodiment of the present invention. The semiconductor device may be, for instance, a processor, a memory controller, and a memory device such as DRAM.

Referring to FIG. 1, the semiconductor device may include a clock generation circuit 100, a signal transmission section 200, and a write control circuit 300.

The clock generation circuit 100 may generate a first write clock WCLK1 and a second write clock WCLK2 which correspond respectively to a rising clock RCLKA and a falling clock FCLKA during a write leveling operation, and generate an input clock DINCLK by delaying a write command WLWT_B by a predetermined time based on the rising clock RCLKA during a write operation. The rising clock RCLKA and the falling clock FCLKA may be clock signals that toggle respectively at a rising edge and a falling edge of an external clock supplied from a controller (not illustrated) to the semiconductor device, and have twice as long a period as that of the external clock. The write command WLWT_B may be set as a signal or a command including a pulse generated during the write operation. The predetermined time may correspond to a write latency WL, which is defined as a time period after which data is actually outputted from a moment when the write command WLWT_B is activated.

The clock generation circuit 100 may receive a mode control signal WLV_MRS for distinguishing the write leveling operation from the write operation. The mode control signal WLV_MRS may be activated during the write leveling operation and outputted from a mode register set as a signal that is deactivated during the write operation.

The signal transmission section 200 may include a first transmission line TL1 that transmits the first write clock WCLK1 or the input clock DINCLK to a first transmission clock WLVCLKR and a second transmission line TL2 that transmits the second write clock WCLK2 to a second transmission clock WLVCLKF. Hereinafter, for the brevity of description, clocks inputted from the clock generation circuit 100 to the signal transmission section 200 may be defined as a first transmission clock WLVCLKR_A and a second transmission clock WLVCLKF_A, while clocks outputted from the signal transmission section 200 to the write control circuit 300 may be defined as the first transmission clock WLVCLKR and the second transmission clock WLVCLKF. Ideally, an input clock and an output clock of the signal transmission section 200 may be the same, but there may actually be a skew or a delay due to the resistance of transmission lines.

The write control circuit 300 may receive the first transmission clock WLVCLKR, the second transmission clock WLVCLKF, a first strobe signal DQS, and a second strobe signal DQSB. Based on the first transmission clock WLVCLKR, the second transmission clock WLVCLKF, the first strobe signal DQS, and the second strobe signal DQSB, the write control circuit 300 may generate a leveling control signal WLV_OUT during the write leveling operation where the mode control signal WLV_MRS is activated, and generate a phase information signal PD_INFO during the write operation where the mode control signal WLV_MRS is deactivated. The first strobe signal DQS and the second strobe signal DQSB may have phases opposite to each other.

The leveling control signal WLV_OUT may have information on a phase difference between the external clock and the first and second strobe signals DQS and DQSB. The semiconductor device may acquire the leveling control signal WLV_OUT by performing the write leveling operation in advance before performing the write operation, and the controller (not illustrated) may adjust the timing of each signal so that a CLK-to-DQS skew may be minimized based on the acquired leveling control signal WLV_OUT.

The phase information signal PD_INFO may have information on which of the first strobe signal DQS and the second strobe signal DQSB is used in advance to drive input data. Although not illustrated, the semiconductor device may further include an internal circuit that performs the write operation. The internal circuit may selectively align data latched based on the first strobe signal DQS or data latched based on the second strobe signal DQSB according to the phase information signal PD_INFO when write data inputted in series is aligned in parallel during the write operation.

As described above, the semiconductor device in accordance with one exemplary embodiment of the present invention may use one shared clock generation circuit and one shared transmission path for the write operation and the write leveling operation. Accordingly, the CLK-to-DQS skew caused by a mismatch between two clock generation circuits or two transmission paths may be minimized, and deterioration of tDQSS characteristics may be prevented. Further, the occupying area and the number of signal transmission lines may be reduced by sharing the clock generation circuit and the transmission path.

Figure 2:
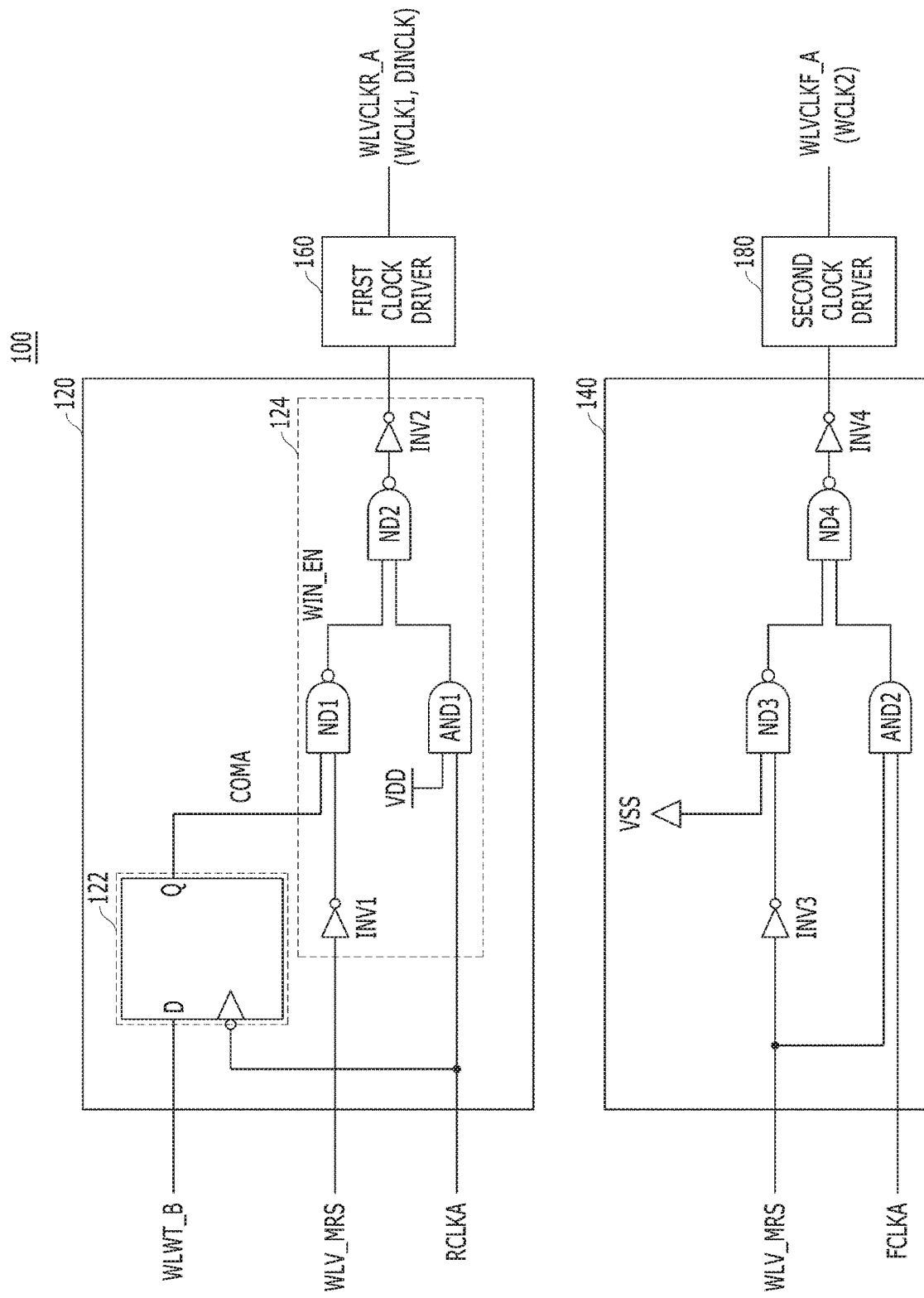
FIG. 2 is a block diagram illustrating a clock generation circuit shown in FIG. 1.

FIG. 2 is a block diagram illustrating the clock generation circuit 100 shown in FIG. 1.

Referring to FIG. 2, the clock generation circuit 100 may include a first clock generation block 120 and a second clock generation block 140.

The first clock generation block 120 may generate the first write clock WCLK1 by buffering the rising clock RCLKA during the write leveling operation where the mode control signal WLV_MRS is activated, and generate the input clock DINCLK by delaying the write command WLWT_B by the predetermined time based on the rising clock RCLKA during the write operation where the mode control signal WLV_MRS is deactivated.

The first clock generation block 120 may include an input latch unit 122 and a clock combination unit 124.

The input latch unit 122 may latch the write command WLWT_B to output as an input comparison signal COMA in response to a falling edge of the rising clock RCLKA. The input latch unit 122 may include a flip-flop. The clock combination unit 124 may buffer the rising clock RCLKA to output as the first write clock WCLK1 when the mode control signal WLV_MRS is activated, and output the rising clock RCLKA as the input clock DINCLK during a specific period of the input comparison signal COMA when the mode control signal WLV_MRS is deactivated.

Specifically, the clock combination unit 124 may include first and second inverters INV1 and INV2, first and second NAND gates ND1 and ND2, and a first AND gate AND1. The first inverter INV1 may invert the mode control signal WLV_MRS. The first NAND gate ND1 may perform a logic NAND operation on an output signal of the first inverter INV1 and the input comparison signal COMA to generate a window enable signal WIN_EN. The first AND gate AND1 may perform the logic NAND operation on a logic high level, e.g., a source voltage VDD level, and the rising clock RCLKA. In other words, the first AND gate AND1 may output the rising clock RCLKA while the source voltage VDD maintains a logic high level. The second NAND gate ND2 and the second inverter INV2 may perform a logic AND operation on an output signal of the first AND gate AND1 and the window enable signal WIN_EN to output as the first transmission clock WLVCLKR_A.

The second clock generation block 140 may generate the second write clock WCLK2 by buffering the falling clock FCLKA during the write leveling operation. The second clock generation block 140 may generate and output the second write clock WCLK2 by buffering the falling clock FCLKA when the mode control signal WLV_MRS is activated, and output the second transmission clock WLVCLKF_A fixed with a specific level to an output terminal when the mode control signal WLV_MRS is deactivated.

Specifically, the second clock generation block 140 may include third and fourth inverters INV3 and INV4, a second AND gate AND2, and third and fourth NAND gates ND3 and ND4. The third inverter INV3 may invert the mode control signal WLV_MRS. The third NAND gate ND3 may perform the logic NAND operation on an output signal of the third inverter INV3 and a logic low level, e.g., a ground voltage VSS level. In other words, the third NAND gate ND3 may output a logic high level regardless of the output signal of the third inverter INV3. The second AND gate AND2 may perform the logic AND operation on the mode control signal WLV_MRS and the falling clock FCLKA. The fourth NAND gate ND4 and the fourth inverter INV4 may perform the logic AND operation on an output signal of the third NAND gate ND3, i.e., the logic high level, and an output signal of the second AND gate AND2 to output as the second transmission clock WLVCLKF_A.

The clock generation circuit 100 may further include a first clock driver 160 and a second clock driver 180. The first clock driver 160 may drive the first transmission clock WLVCLKR_A outputted from the first clock generation block 120 to output to the first transmission line TL1. The second clock driver 180 may drive the second transmission clock WLVCLKF_A outputted from the second clock generation block 140 to output to the second transmission line 112.

Figure 3A:
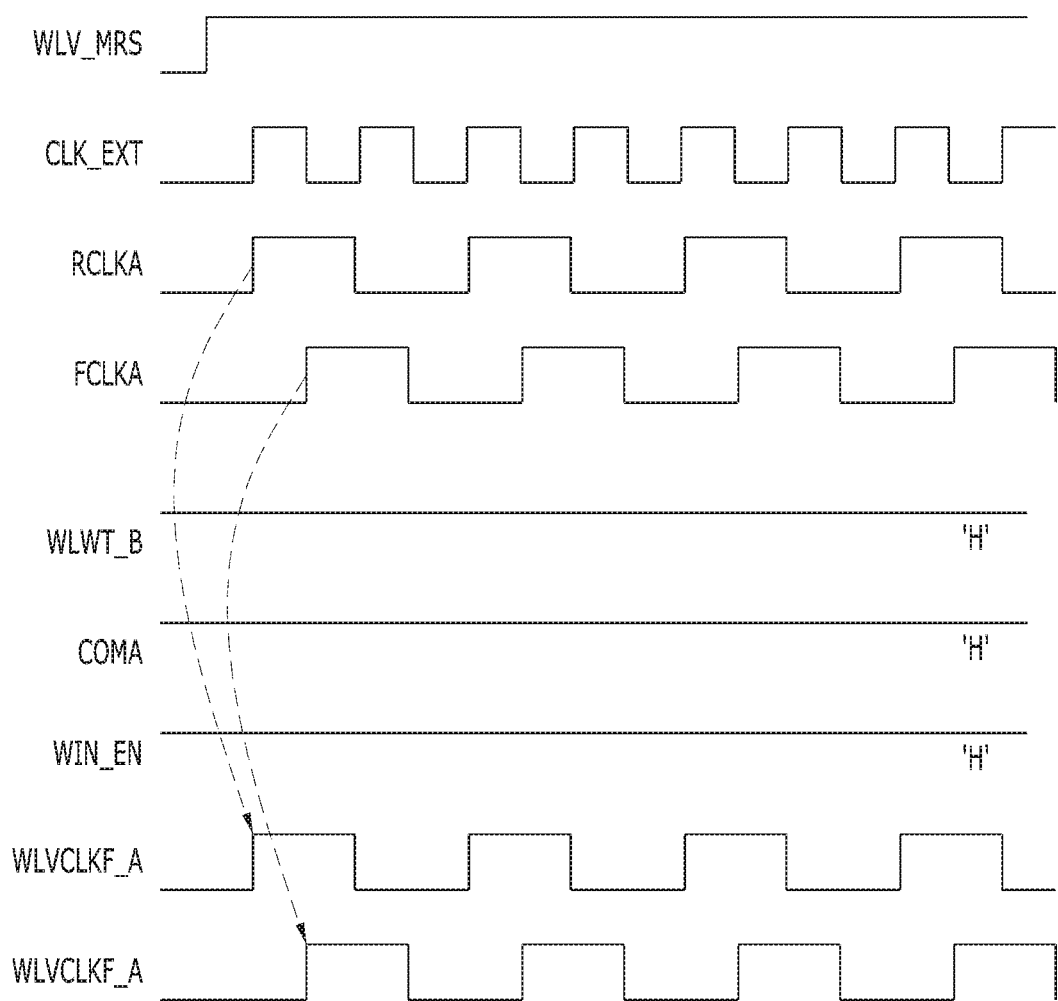
FIGS. 3A and 3B are timing diagrams illustrating an exemplary operation of a clock generation circuit shown in FIG. 2.
Figure 3B:
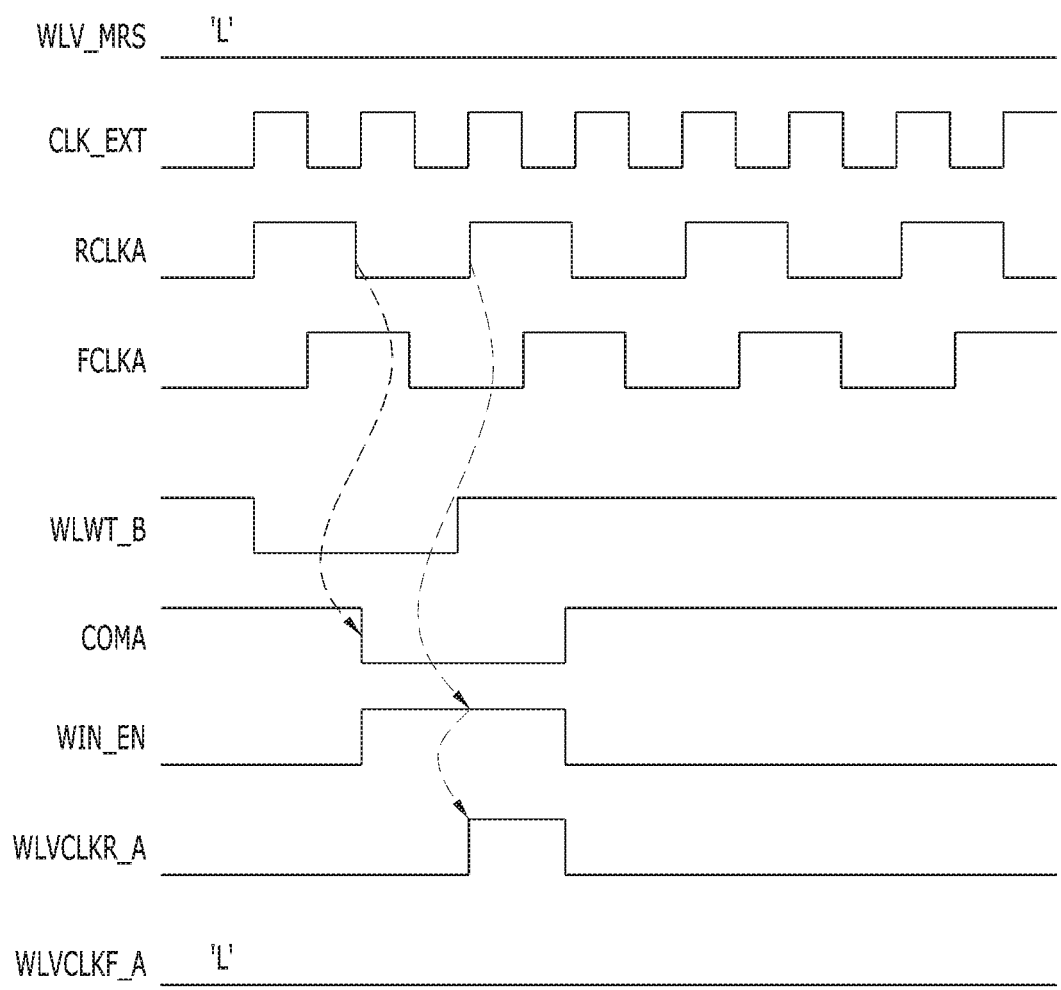

FIGS. 3A and 3B are timing diagrams illustrating an operation of the clock generation circuit 100 shown in FIG. 2.

Referring to FIG. 3A, the write leveling operation where the mode control signal WLV_MRS is activated to a logic high level is illustrated.

The rising clock RCLKA and the falling clock FCLKA that toggle respectively at the rising edge and the falling edge by dividing an external clock CLK_EXT supplied from the controller (not illustrated) to the semiconductor device may be generated.

During the write leveling operation, the write command WLWT_B with a logic high level may be kept in a deactivation state.

Accordingly, the input latch unit 122 included in the first clock generation block 120 may latch the input comparison signal COMA to a logic high level. The clock combination unit 124 may buffer the rising clock RCLKA to output as the first write clock WCLK1 based on the window enable signal WIN_EN having the logic high level. The second clock generation block 140 may buffer the falling clock FCLKA to output as the second write clock WCLK2 based on the mode control signal WLV_MRS having the logic high level.

As described above, the clock generation circuit 100 may generate the first write clock WCLK1 and the second write clock WCLK2 which correspond respectively to the rising clock RCLKA and the falling clock FCLKA during the write leveling operation where the mode control signal WLV_MRS is activated. The first write clock WCLK1 and the second write clock WCLK2 may have a phase difference of approximately 90 degrees therebetween.

Referring to FIG. 3B, the write operation where the mode control signal WLV_MRS maintains a logic low level is illustrated.

The rising clock RCLKA and the falling clock FCLKA that toggle respectively at the rising edge and the falling edge by dividing the external clock CLK_EXT supplied from the controller (not illustrated) to the semiconductor device may be generated.

During the write operation, the write command WLWT_B may be inputted in a pulse shape having a logic low level during a predetermined period.

The input latch unit 122 included in the first clock generation block 120 may latch the write command WLWT_B in the falling edge of the rising clock RCLKA to output the input comparison signal COMA. Accordingly, the clock combination unit 124 may output the window enable signal WIN_EN having an activation period of the logic high level during a predetermined period, and consequently output the rising clock RCLKA as the input clock DINCLK during the activation period of the window enable signal WIN_EN. The second clock generation block 140 may output the second transmission clock WLVCLKF_A fixed with a specific level, for example, the logic low level, to the output terminal based on the mode control signal WLV_MRS having the logic low level.

As described above, the clock generation circuit 100 may generate the input clock DINCLK having substantially the same pulse width as an activation period of the rising clock RCLKA during the write operation where the mode control signal WLV_MRS is deactivated.

Figure 4:
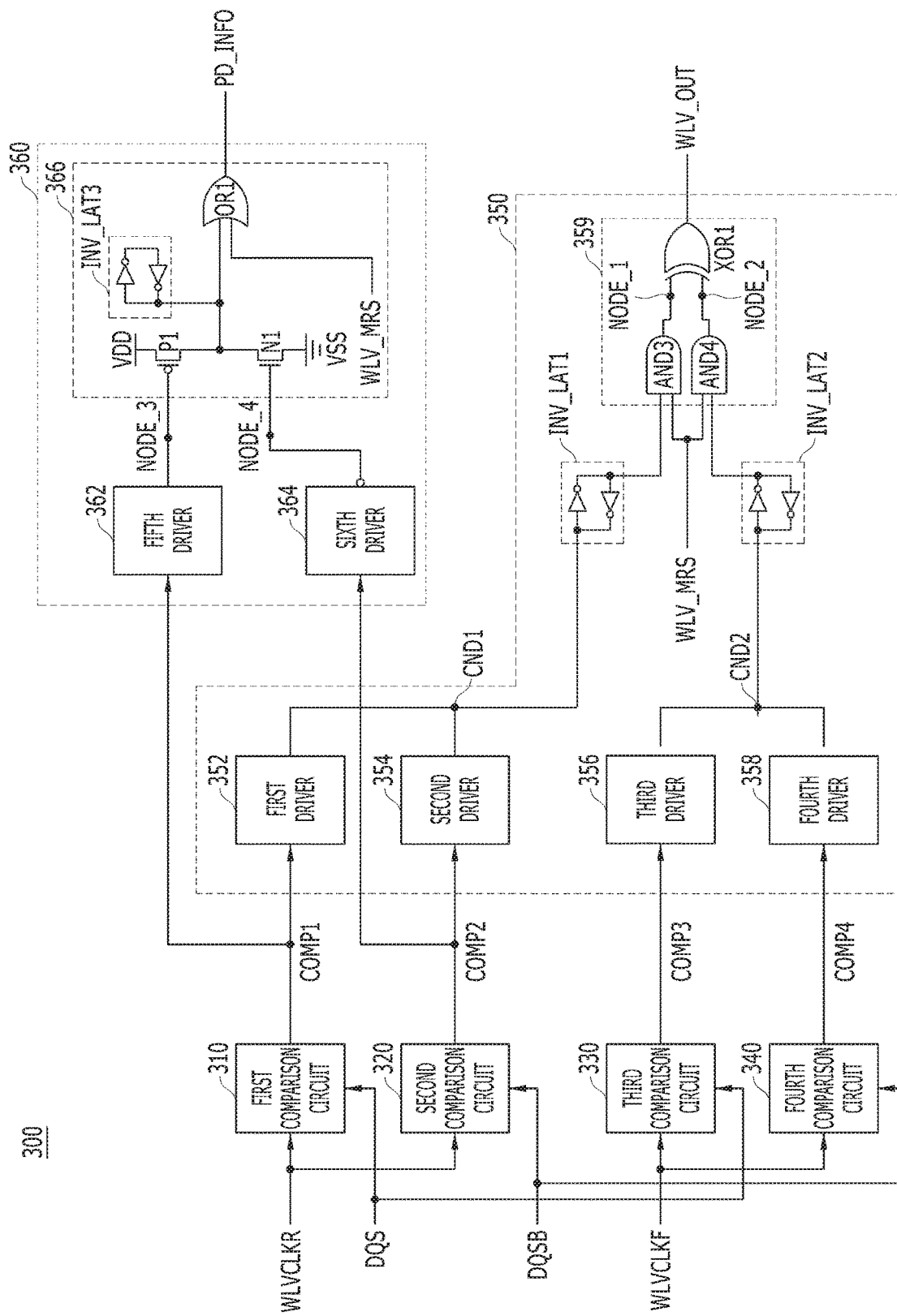
FIG. 4 is a block diagram illustrating a write control circuit shown in FIG. 1.

FIG. 4 is a block diagram illustrating the write control circuit 300 shown in FIG. 1.

Referring to FIG. 4, the write control circuit 300 may include the first to fourth comparison circuits 310 to 340, a write leveling control block 350, and a write operation control block 360.

The first comparison circuit 310 may compare the phase of the first strobe signal DQS with the phase of the first transmission clock WLVCLKR. For example, the first comparison circuit 310 may output the first transmission clock WLVCLKR as a first comparison signal COMP1 in response to a rising edge of the first strobe signal DQS.

The second comparison circuit 320 may compare the phase of the second strobe signal DQSB with the phase of the first transmission clock WLVCLKR. For example, the second comparison circuit 320 may output the first transmission clock WLVCLKR as a second comparison signal COMP2 in response to a rising edge of the second strobe signal DQSB.

The third comparison circuit 330 may compare the phase of the first strobe signal DQS with the phase of the second transmission clock WLVCLKF. For example, the third comparison circuit 330 may output the second transmission clock WLVCLKF as a third comparison signal COMP3 in response to the rising edge of the first strobe signal DQS.

The fourth comparison circuit 340 may compare the phase of the second strobe signal DQSB with the phase of the second transmission clock WLVCLKF. For example, the fourth comparison circuit 340 may output the second transmission clock WLVCLKF as a fourth comparison signal COMP4 in response to the rising edge of the second strobe signal DQSB.

The respective first to fourth comparison circuits 310 to 340 may output levels of the transmission clocks WLVCLKR and WLVCLKF as the respective comparison signals COMP1 to COMP4 in response to the rising edges of the strobe signals DQS and DQSB. When the comparison circuit outputs a high level as the comparison signal, the rising edge of the transmission clock may be ahead of the rising edge of the strobe signal, which indicates that the phase of the transmission clock may be ahead of the phase of the strobe signal. On the contrary, when the comparison circuit outputs a low level as the comparison signal, the rising edge of the transmission clock may be behind the rising edge of the strobe signal, which indicates that the phase of the transmission clock may be behind the phase of the strobe signal. Each of the first to fourth comparison circuits 310 to 340 may include a flip-flop according to one exemplary embodiment.

The first and third comparison circuits 310 and 330 may be disabled during a deactivation period of the first strobe signal DQS, and the second and fourth comparison circuits 320 and 340 may be disabled during a deactivation period of the second strobe signal DQSB. The comparison signals COMP1 to COMP4 outputted from the disabled comparison circuits 310 to 340 may be outputted in a floating state. In this case, since the first strobe signal DQS and the second strobe signal DQSB have phases opposite to each other, the first comparison circuit 310 and the second comparison circuit 320 may operate in a complementary manner, and the third comparison circuit 330 and the fourth comparison circuit 340 may operate in a complementary manner.

The write leveling control block 350 may drive the first to fourth comparison signals COMP1 to COMP4 to generate the leveling control signal WLV_OUT based on the mode control signal WLV_MRS. The write leveling control block 350 may determine whether the first comparison signal COMP1 and the third comparison signal COMP3 have the same level or whether the second comparison signal COMP2 and the fourth comparison signal COMP4 have the same level to generate the leveling control signal WLV_OUT during the during the write leveling operation where the mode control signal WLV_MRS is activated.

Specifically, the write leveling control block 350 may include first to fourth drivers 352 to 358 and a determining unit 359.

The first driver 352 may invert and drive a first common node CND1 based on the first comparison signal COMP1. The second drive 354 may invert and drive the first common node CND1 based on the second comparison signal COMP2. The third driver 356 may invert and drive a second common node CND2 based on the third comparison signal COMP3. The fourth driver 358 may invert and drive the second common node CND2 based on the fourth comparison signal COMP4. The first to fourth drivers 352 to 358 may include a PMOS transistor and an NMOS transistor, which are coupled in series between a source voltage VDD terminal and a ground voltage VSS terminal and receive the corresponding comparison signals at their respective gates.

The write leveling control block 350 may further include a first latch unit INV_LAT1 and a second latch unit INV_LAT2. The first latch unit INV_LAT1 and the second latch unit INV_LAT2 may be coupled to the first common node CND1 and the second common node CND2, respectively, and invert and latch voltages of the corresponding nodes. According to one embodiment, the first driver 352 and the first latch unit INV_LAT1 may constitute a first driving part, while the second driver 354 and the first latch unit INV_LAT1 may constitute a second driving part. Likewise, the third driver 356 and the second latch unit INV_LAT2 may constitute a third driving part, while the fourth driver 358 and the second latch unit INV_LAT2 may constitute a fourth driving part.

The determining unit 359 may generate the leveling control signal WLV_OUT by determining whether the voltage of the first common node CND1 and the voltage of the second common node CND2 are the same or not when the mode control signal WLV_MRS is activated.

Specifically, the determining unit 359 may include third and fourth AND gates AND3 and AND4 and an exclusive OR gate XOR1. The third AND gate AND3 may perform the logic AND operation on the mode control signal WLV_MRS and an output signal of the first latch unit INV_LAT1 to output to a first node NODE_1, and the fourth AND gate AND4 may perform the logic AND operation on the mode control signal WLV_MRS and an output signal of the second latch unit INV_LAT2 to output to a second node NODE_2. The exclusive OR gate XOR1 may perform a logic XOR operation on output signals of the third and fourth AND gates AND3 and AND4. Therefore, when the mode control signal WLV_MRS is activated, the determining unit 359 may compare the output signals of the third and fourth AND gates AND3 and AND4. When the output signals of the third and fourth AND gates AND3 and AND4 are the same as a result of the comparison, the determining unit 359 may output a logic low level, and when the output signal of the third and fourth AND gates AND3 and AND4 are different as a result of the comparison, the determining unit 359 may output a logic high level.

The write operation control block 360 may drive the first and second comparison signals COMP1 and COMP2 to generate the phase information signal PD_INFO based on the mode control signal WLV_MRS. During the write operation where the mode control signal WLV_MRS is deactivated, the write operation control block 360 may activate the phase information signal PD_INFO when the first comparison signal COMP1 has a specific level, for example, the logic high level, and may deactivate the phase information signal PD_INFO when the second comparison signal COMP2 has a specific level, for example, the logic high level.

Specifically, the write operation control block 360 may include a fifth driver 362, a sixth driver 364, and an information output unit 366.

The fifth driver 362 may invert and drive a third node NODE_3 based on the first comparison signal COMP1. The sixth driver 364 may drive a fourth node NODE_4 based on the second comparison signal COMP2. The fifth and sixth drivers 362 and 364 may include a PMOS transistor and an NMOS transistor, which are coupled in series between the source voltage VDD terminal and the ground voltage VSS terminal and receive the corresponding comparison signals at their respective gates.

When the mode control signal WLV_MRS is deactivated, the information output unit 366 may activate the phase information signal PD_INFO based on the voltage of the third node NODE_3 and deactivate the phase information signal PD_INFO based on the voltage of the fourth node NODE_4. When the mode control signal WLV_MRS is activated, the information output unit 366 may fix and output the phase information signal PD_INFO with a specific level, for example, the logic high level.

Specifically, the information output unit 366 may include a PMOS transistor P1, an NMOS transistor N1, a third latch unit INV_LAT3, and an OR gate OR1.

The PMOS transistor P1 and the NMOS transistor N1, which are coupled in series between the source voltage VDD terminal and the ground voltage VSS terminal, may receive the voltage of the third node NODE_3 and the voltage of the fourth node NODE_4 at their respective gates. The drain of the PMOS transistor P1 and the drain of the NMOS transistor N1 may be coupled to an output terminal. The third latch unit INV_LAT3 may latch the voltage of the output terminal. The OR gate OR1 may perform a logic OR operation on the voltage of the output terminal and the mode control signal WLV_MRS to output the phase information signal PD_INFO.

Figure 5A:
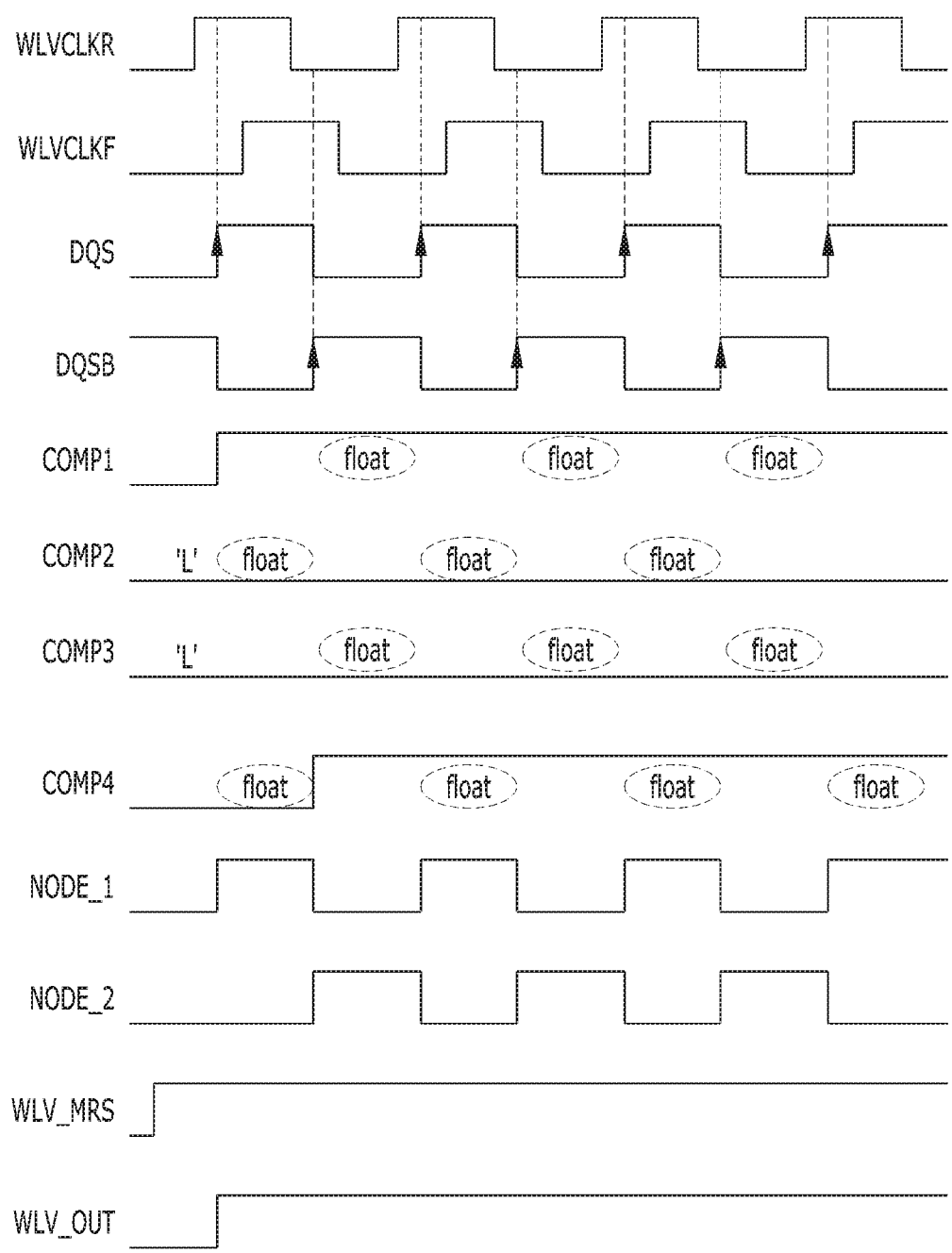
FIGS. 5A and 5B are timing diagrams illustrating an exemplary operation of a write control circuit shown in FIG. 4.
Figure 5B:
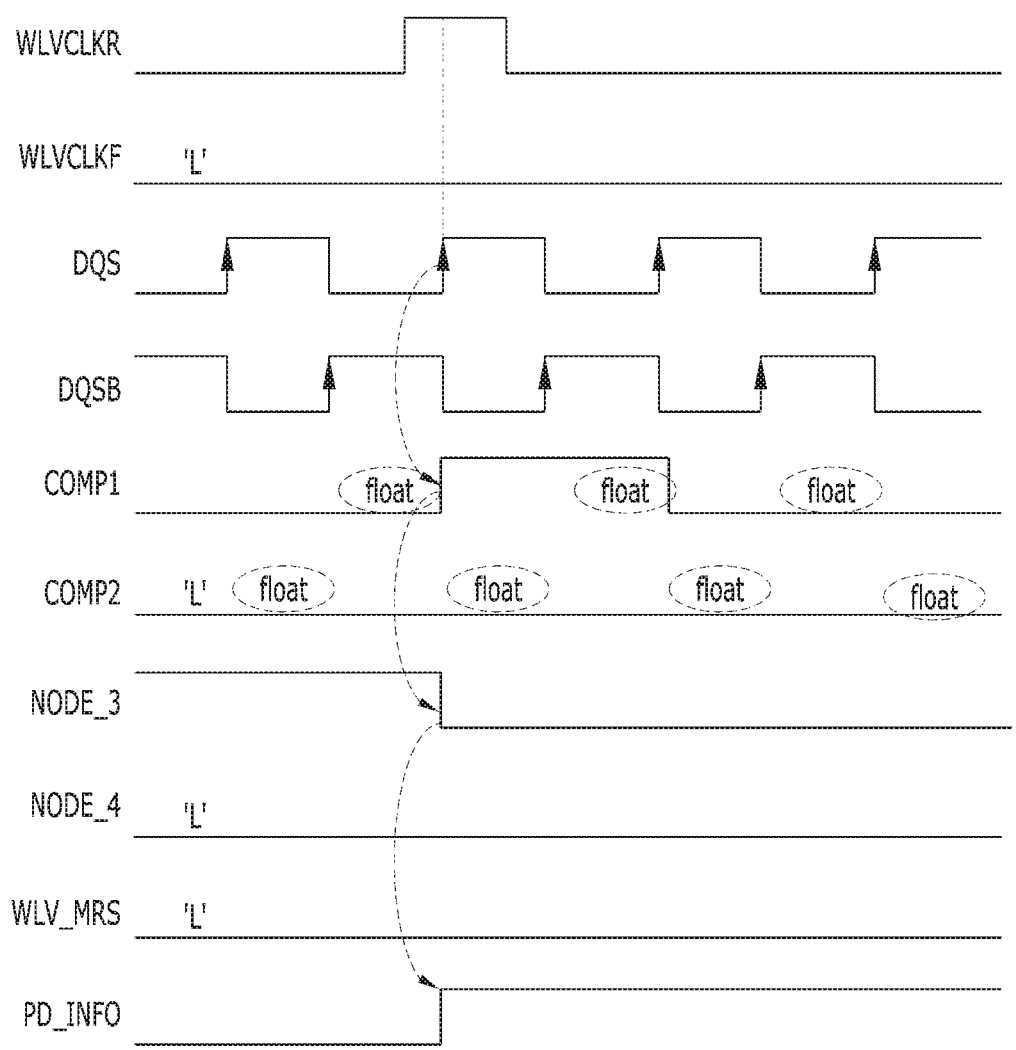

FIGS. 5A and 5B are timing diagrams illustrating an operation of the write control circuit 300 shown in FIG. 4.

Referring to FIG. 5A, the write leveling operation where the mode control signal WLV_MRS is activated to the logic high level is illustrated.

The first comparison circuit 310 may output the first transmission clock WLVCLKR as the first comparison signal COMP1 in response to the rising edge of the first strobe signal DQS, and the third comparison circuit 330 may output the second transmission clock WLVCLKF as the third comparison signal COMP3 in response to the rising edge of the first strobe signal DQS. The second comparison circuit 320 may output the first transmission clock WLVCLKR as the second comparison signal COMP2 in response to the rising edge of the second strobe signal DQSB, and the fourth comparison circuit 340 may output the second transmission clock WLVCLKF as the fourth comparison signal COMP4 in response to the rising edge of the second strobe signal DQSB.

The first and third comparison circuits 310 and 330 may be disabled during the deactivation period of the first strobe signal DQS, thereby outputting the first and third comparison signals COMP1 and COMP3 in the floating state. The second and fourth comparison circuits 320 and 340 may be disabled during the deactivation period of the second strobe signal DQSB, thereby outputting the second and fourth comparison signal COMP2 and COMP4 in the floating state.

The write leveling control block 350 may determine whether the first comparison signal COMP1 and the third comparison signal COMP3 have the same level or whether the second comparison signal COMP2 and the fourth comparison signal COMP4 have the same level to generate the leveling control signal WLV_OUT.

Specifically, while the mode control signal WLV_MRS is activated to the logic high level, a signal obtained by adding the first comparison signal COMP1 and the second comparison signal COMP2 may be applied to the first node NODE_1 through the first driving part 352 and INV_LAT1 and the second driving part 354 and INV_LAT1, and a signal obtained by adding the third comparison signal COMP3 and the fourth comparison signal COMP4 may be applied to the second node NODE_2 through the third driving part 356 and INV_LAT2 and the fourth driving part 358 and INV_LAT2. The determining unit 359 may determine whether the voltage of the first node NODE_1 and the voltage of the second node NODE_2 are the same or not to generate the leveling control signal WLV_OUT.

Therefore, the write leveling control block 350 may generate the leveling control signal WLV_OUT, which is activated to the logic high level, when the levels of the first and second transmission clocks WLVCLKR and WLVCLKF are different from each other at the rising edge of any one of the first and second strobe signals DQS and DQSB. In addition, the write leveling control block 350 may generate the leveling control signal WLV_OUT, which is deactivated to the logic low level, when the levels of the first and second transmission clocks WLVCLKR and WLVCLKF are the same at the rising edge of any one of the first and second strobe signals DQS and DQSB. The write leveling control block 350 may output the leveling control signal WLV_OUT fixed with the specific level, i.e., the logic low level during the write operation where the mode control signal WLV_MRS is deactivated.

During the write leveling operation, the first and second transmission clocks WLVCLKR and WLVCLKF, which are generated by diving the external clock CLK_EXT, may have a phase difference of approximately 90 degrees therebetween. Referring back to FIG. 3A, the external clock CLK_EXT may have the logic high level when the first transmission clock WLVCLKR_A and the second transmission clock WLVCLKF_A have different levels, and have the logic low level when the first transmission clock WLVCLKR_A and the second transmission clock WLVCLKF_A have the same level. On the basis of these characteristics, it can be determined whether the levels of the first transmission clock WLVCLKR and the second transmission clock WLVCLKF are the same or not at the rising edge of the first strobe signal DQS or the second strobe signal DQSB, and it can be also determined whether the phase of the external clock CLK_EXT is faster or slower than the phase of the first strobe signal DQS or the second strobe signal DQSB, during the write leveling operation. In other words, when the leveling control signal WLV_OUT has the logic high level, the leveling control signal WLV_OUT may include information that the phase of the external clock CLK_EXT is ahead of the phases of the first and second strobe signals DQS and DQSB. When the leveling control signal WLV_OUT has the logic low level, the leveling control signal WLV_OUT may include information that the phase of the external clock CLK_EXT is behind the phases of the first and second strobe signals DQS and DQSB.

Referring to FIG. 5B, the write operation where the mode control signal WLV_MRS maintains the logic low level is illustrated.

The first comparison circuit 310 may output the first transmission clock WLVCLKR as the first comparison signal COMP1 in response to the rising edge of the first strobe signal DQS, and the second comparison circuit 320 may output the first transmission clock WLVCLKR as the second comparison signal COMP2 in response to the rising edge of the second strobe signal DQSB. The first comparison circuit 310 may be disabled during the deactivation period of the first strobe signal DQS, thereby outputting the first comparison signal COMP1 in the floating state. The second comparison circuit 320 may be disabled during the deactivation period of the second strobe signal DQSB, thereby outputting the second comparison signal COMP2 in the floating state. Since the first transmission clock WLVCLKR has a pulse width that is activated during a predetermined period, the first comparison circuit 310 may output the first comparison signal COMP1 that is activated during a predefined period at the rising edge of the first strobe signal DQS.

The write operation control block 360 may activate the phase information signal PD_INFO based on the first comparison signal COMP1 having the logic high level.

Specifically, the fifth driver 362 may invert and drive the third node NODE_3 based on the first comparison signal COMP1, and the sixth driver 364 may drive the fourth node NODE_4 based on the second comparison signal COMP2. While the mode control signal WLV_MRS is deactivated to the logic low level, the information output unit 366 may fix and output the phase information signal PD_INFO with the logic high level during the write leveling operation where the mode control signal WLV_MRS is activated.

Therefore, the first and second comparison circuits 310 and 320 may sample the first transmission clock WLVCLKR at the rising edges of the first and second strobe signals DQS and DQSB, respectively. The write operation control block 360 may activate and output the phase information signal PD_INFO when sampled values are meaningful values, for example, the logic high level. Thus, the phase information signal PD_INFO can indicate whether the rising edge of any one of the first and second strobe signals DQS and DQSB is overlapped with the activation period of the first transmission clock WLVCLKR. When the write data inputted in series are aligned in parallel during the write operation performed by the internal circuit of the semiconductor device, the internal circuit may selectively align the data latched based on the first strobe signal DQS or the data latched based on the second strobe signal DQSB according to the phase information signal PD_INFO.

As described above, a clock for the write leveling operation and a clock for the write operation can be transmitted using only two transmission lines in accordance with one or more embodiments of the present disclosure. In other words, a 4-phase clock of approximately 0, 90, 180, and 270 degrees may not be needed as in a conventional write leveling operation, but a 2-phase clock of approximately 0 and 90 degrees may be sufficient in the transmission structure according to one or more embodiments of the present invention. During the write operation, a clock may be transmitted to only one of the two transmission lines. In addition, a receiving structure where a frequency multiplier is not used may be used so that an operation to compare the phase of the external clock with the phase of the strobe signal using the 2-phase clock is performed. Accordingly, one or more embodiments of the present invention can help reduce the number of transmission lines and the area occupied by the clock generation circuit, and reduce a mismatch between the write leveling operation and the write operation, thereby minimizing a CLK-to-DQS skew after the write leveling operation is performed.

Figure 6:
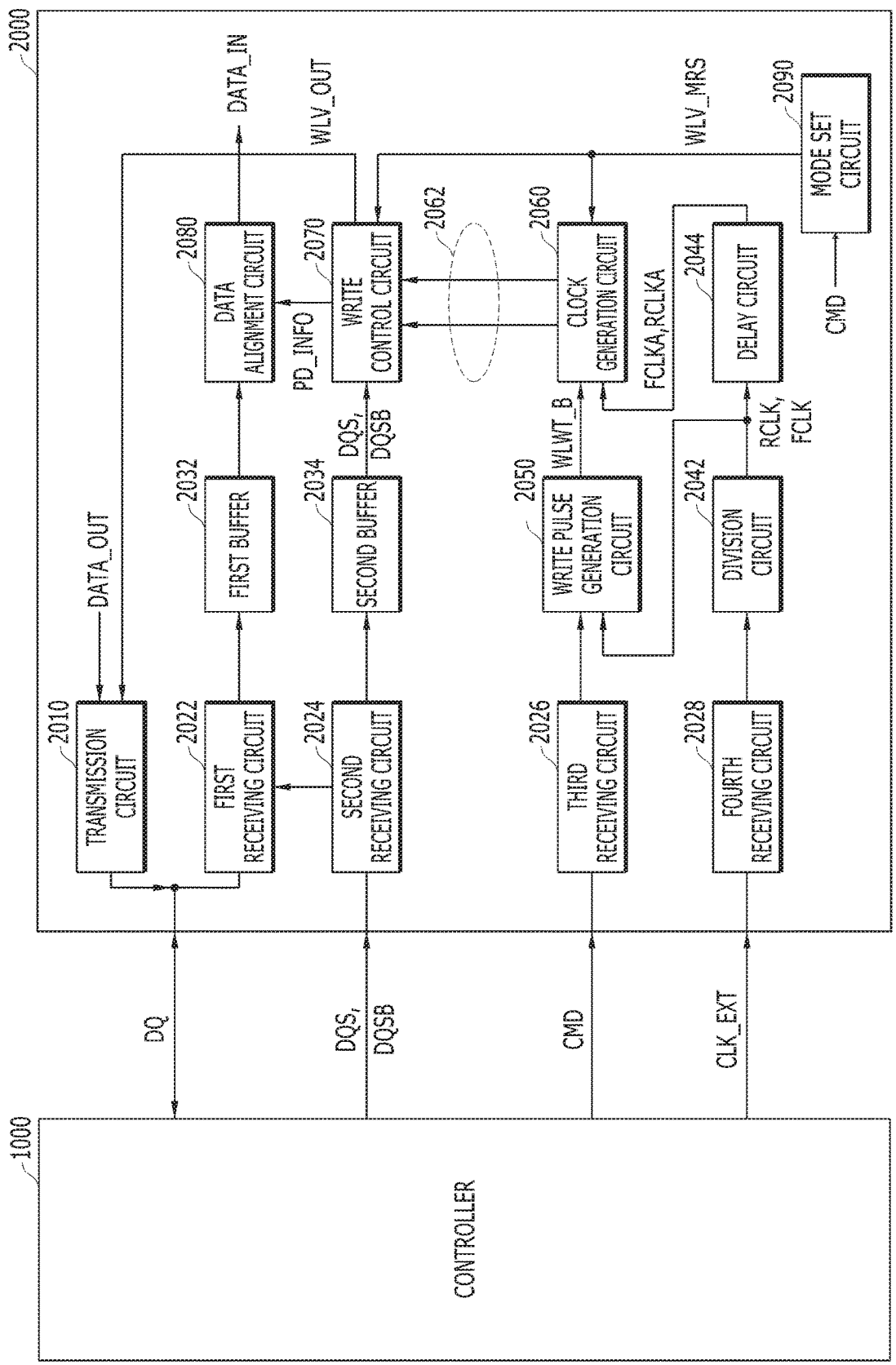
FIG. 6 is a block diagram illustrating a semiconductor system in accordance with an embodiment of the present invention.

FIG. 6 is a block diagram illustrating a semiconductor system in accordance with an embodiment of the present invention.

Referring to FIG. 6, the semiconductor system may include a controller 1000 and a semiconductor device 2000.

The controller 1000 may transmit and receive signals with the semiconductor device 2000. For example, the controller 1000 may transmit and receive data DQ with the semiconductor device 2000. The controller 1000 may transmit strobe signals DQS and DQSB, a command CMD, and an external clock CLK_EXT.

The semiconductor device 2000 may include a transmission circuit 2010, first to fourth receiving circuits 2022, 2024, 2026, and 2028, first and second buffers 2032 and 2034, a division circuit 2042, a delay circuit 2044, a write pulse generation circuit 2050, a clock generation circuit 2060, a signal transmission block 2062, a write control circuit 2070, a data alignment circuit 2080, and a mode set circuit 2090.

The transmission circuit 2010 may transmit output data DATA_OUT and a leveling control signal WLV_OUT as the data DQ to the controller 1000.

The first receiving circuit 2022 may receive the data DQ transmitted from the controller 1000 based on the first and second strobe signals DQS and DQSB.

The second receiving circuit 2024 may receive the first and second strobe signals DQS and DQSB transmitted from the controller 1000. The second receiving circuit 2024 may transmit the first and second strobe signals DQS and DQSB to the first receiving circuit 2022.

The third receiving circuit 2026 may receive the command CMD transmitted from the controller 1000.

The fourth receiving circuit 2028 may receive the externa clock CLK_EXT transmitted from the controller 1000.

The first buffer 2032 may receive and buffer an output signal of the first receiving circuit 2022, and transmit the buffered signal to the data alignment circuit 2080. For example, the first buffer 2032 may buffer the data DQ inputted from the first receiving circuit 2022, and transmit the buffered data to the data alignment circuit 2080.

The second buffer 2034 may receive and buffer output signals of the second receiving circuit 2024, and transmit the buffered signals to the write control circuit 2070. For example, the second buffer 2034 may buffer the first and second strobe signals DQS and DQSB inputted from the second receiving circuit 2024, and transmit the buffered signals to the write control circuit 2070. The phase of the first strobe signal DQS may be opposite to one of the second strobe signal DQSB.

The division circuit 2042 may receive and divide an output signal of the fourth receiving circuit 2028 to generate a rising clock RCLK and a falling clock FCLK that toggle respectively at a rising edge and a falling edge of the external clock CLK_EXT.

The delay circuit 2044 may delay the rising clock RCLK and the falling clock FCLK outputted from the division circuit 2042, and transmit the delayed clocks to the clock generation circuit 2060. The delay circuit 2044 may have a delay time which corresponds to a time required for generating a write command WLWT_B from the write pulse generation circuit 2050.

The write pulse generation circuit 2050 may generate the write command WLWT_B in response to an output signal of the third receiving circuit 2026 and the rising clock RCLK and falling clock FCLK outputted from the division circuit 2042. For example, the write pulse generation circuit 2050 may generate the write command WLWT_B which is synchronized with an output signal of the division circuit 2042 when the command CMD inputted from the third receiving circuit 2026 is a write operation command.

The clock generation circuit 2060 may generate first and second write clocks or an input clock based on the write command WLWT_B and a rising clock RCLKA and a falling clock FCLKA outputted from the delay circuit 2044 in response to a mode control signal WLV_MRS. The clock generation circuit 2060 may generate the first write dock and the second write dock which correspond respectively to the rising clock RCLKA and the falling clock FCLKA during a write leveling operation where the mode control signal WLV_MRS is activated, and generate the input clock by delaying the write command WLWT_B by a predetermined time based on the rising clock RCLKA during a write operation where the mode control signal WLV_MRS is deactivated. Since the clock generation circuit 2060 shown in FIG. 6 is substantially the same as the clock generation circuit 100 shown in FIG. 1, detailed descriptions thereof are not repeated.

The signal transmission block 2062 may include two transmission lines which transmit the first write clock or the input clock as a first transmission clock WLVCLKR and transmit the second write clock as a second transmission clock WLVCLKF. Since the signal transmission block 2062 shown in FIG. 6 is substantially the same as the signal transmission section 200 shown in FIG. 1, detailed descriptions thereof are not repeated.

The write control circuit 2070 may receive the first transmission clock WLVCLKR, the second transmission clock WLVCLKF, the first strobe signal DQS, and the second strobe signal DQSB, generate the leveling control signal WLV_OUT during the write leveling operation where the mode control signal WLV_MRS is activated, and generate a phase information signal PD_INFO during the write operation where the mode control signal WLV_MRS is deactivated. Since the write control circuit 2070 shown in FIG. 6 is substantially the same as the write control circuit 300 shown in FIG. 1, detailed descriptions thereof are not repeated.

The data alignment circuit 2080 may align an output signal of the first buffer 2032, i.e., the data DQ in response to the phase information signal PD_INFO, and output the aligned data as an input data DATA_IN. For example, the data alignment circuit 2080 may adjust an alignment order of the data DQ transmitted from the controller 1000 in response to the phase information signal PD_INFO, thereby outputting as the input data DATA_IN.

The mode set circuit 2090 may set whether or not the mode control signal WLV_MRS is activated in response to the command CMD transmitted from the controller 1000, and output the mode control signal WLV_MRS of which the activation or deactivation is determined. The mode set circuit 2090, which is a storage circuit to set the environments of the semiconductor device, may include a mode register set.

Hereinafter, an exemplary operation of the semiconductor system having the aforementioned configuration is described.

The controller 1000 may generate the signals such as the data DQ, the first and second strobe signals DQS and DQSB, and the command CMD based on the external clock CLK_EXT, and transmit the generated signals along with the external clock CLK_EXT to the semiconductor device 2000.

The semiconductor device 2000 may receive the data DQ in response to the first and second strobe signals DQS and DQSB, and receive the command CMD in response to the external clock CLK_EXT.

The controller 1000 and the semiconductor device 2000 may perform a training operation in advance before a normal operation for normally transmitting and receiving the signals to normally perform the normal operation. The training operation may include the write leveling operation for setting the phases of the first and second strobe signals DQS and DQSB transmitted from the controller 1000 to the semiconductor device 2000 and the phase of the external clock CLK_EXT to be equal to each other.

The controller 1000 may transmit the command CMD to the semiconductor device 2000, and the mode set circuit 2090 that sets the operation environments of the semiconductor device 2000 may determine and store whether or not the mode control signal WLV_MRS is activated, in response to the command CMD. The controller 1000 may control the mode control signal WLV_MRS, which is activated based on the command CMD, to be outputted from the mode set circuit 2090. Accordingly, the write leveling operation may be performed.

The controller 1000 may transmit the external clock CLK_EXT and the first and second strobe signals DQS and DQSB to the semiconductor device 2000.

The first and second strobe signals DQS and DQSB transmitted from the controller 1000 may be inputted to the write control circuit 2070 through the second receiving circuit 2024 and the second buffer 2034.

The external dock CLK_EXT transmitted from the controller 1000 may be transmitted to the division circuit 2042 through the fourth receiving circuit 2028.

The division circuit 2042 may divide the external dock CLK_EXT to generate the rising clock RCLK and the falling clock FCLK. The rising clock RCLK and the falling dock FCLK may be transmitted as the rising clock RCLKA and the falling dock FCLKA to the clock generation circuit 2060 through the delay circuit 2044.

When the mode control signal WLV_MRS is activated, the clock generation circuit 2060 may generate the first and second write clocks that correspond respectively to the rising clock RCLKA and the falling dock FCLKA, The rising clock RCLKA and the falling clock FCLKA may have a phase difference of approximately 90 degrees therebetween.

The signal transmission block 2062 may transmit the first write clock and the second write clock as the first transmission clock WLVCLKR and the second transmission clock WLVCLKF, respectively, to the write control circuit 2070.

When the mode control signal WLV_MRS is activated, the write control circuit 2070 may transmit a result obtained by comparing the phases of the first and second strobe signals DQS and DQSB with the phases of the first and second transmission clocks WLVCLKR and WLVCLKF as the leveling control signal WLV_OUT to the transmission circuit 2010. In other words, the write control circuit 2070 may transmit the leveling control signal WLV_OUT having information on the phase difference between the external clock CLK_EXT and the first and second strobe signals DQS and DQSB to the transmission circuit 2010.

The transmission circuit 2010 may transmit the leveling control signal WLV_OUT as the data DQ to the controller 1000.

The controller 1000 may control the timing of the first and second strobe signals DQS and DQSB and the external clock CLK_EXT in response to the data DQ including the leveling control signal WLV_OUT. For example, when the leveling control signal WLV_OUT transmitted from the semiconductor device 2000 includes information that the phase of the external clock CLK_EXT is faster than the phases of the first and second strobe signals DQS and DQSB, the controller 1000 may delay the output timing of the external clock CLK_EXT or advance the output timing of the first and second strobe signals DQS and DQSB. When the leveling control signal WLV_OUT transmitted from the semiconductor device 2000 includes information that the phase of the external clock CLK_EXT is slower than the phases of the first and second strobe signals DQS and DQSB, the controller 1000 may advance the output timing of the external clock CLK_EXT or delay the output timing of the first and second strobe signals DQS and DQSB.

The controller 1000 and the semiconductor device 2000 may repeatedly perform the aforementioned operation so that the phases of the first and second strobe signals DQS and DQSB inputted to the semiconductor device 2000 are set to be equal to the phase of the external dock CLK_EXT inputted to the semiconductor device 2000.

When the phases of the first and second strobe signals DQS and DQSB are equal to the phase of the external dock CLK_EXT, the controller 1000 may deactivate and output the mode control signal WLV_MRS which is activated and outputted from the mode set circuit 2090 based on the command CMD.

Subsequently, the controller 1000 may transmit the data DQ, the first and second strobe signals DQS and DQSB, the command CMD and the external dock CLK_EXT to the semiconductor device 2000. In one embodiment, the command CMD may be a write operation command.

The data DQ inputted to the semiconductor device 2000 may be transmitted to the data alignment circuit 2080 through the first receiving circuit 2022 and the first buffer 2032.

The first and second strobe signals DQS and DQSB inputted to the semiconductor device 2000 may be transmitted to the write control circuit 2070 through the second receiving circuit 2024 and the second buffer 2034.

The external clock CLK_EXT inputted to the semiconductor device 2000 may be transmitted to the division circuit 2042 through the fourth receiving circuit 2028. The division circuit 2042 may divide the external dock CLK_EXT to generate the rising dock RCLK and the falling dock FCLK, and transmit the rising dock RCLK and the falling dock FCLK to the write pulse generation circuit 2050.

The command CMD inputted to the semiconductor device 2000 may be transmitted to the write pulse generation circuit 2050 through the third receiving circuit 2026. The write pulse generation circuit 2050 may generate the write command WLWT_B in response to the output signal of the third receiving circuit 2026 and the rising clock RCLK and the falling clock FCLK outputted from the division circuit 2042.

When the mode control signal WLV_MRS is deactivated, the clock generation circuit 2060 may generate the input clock by delaying the write command WLWT_B by a predetermined time based on the rising clock RCLKA. The input clock may have substantially the same pulse width as an activation period of the rising clock RCLKA.

The signal transmission block 2062 may transmit the input clock as the first transmission clock WLVCLKR to the write control circuit 2070.

When the mode control signal WLV_MRS is deactivated, the write control circuit 2070 may determine which of the first and second strobe signals DQS and DQSB has the write command WLWT_B synchronized with the rising timing, and output the phase information signal PD_INFO to the data alignment circuit 2080, based on the first and second strobe signals DQS and DQSB and the first transmission dock WLVCLKR.

The data alignment circuit 2080 may align the signal outputted from the first buffer 2032 in response to the phase information signal PD_INFO and output the aligned signal as the input data DATA_IN to the interior of the semiconductor device. The phase information signal PD_INFO may have information on which of the first strobe signal DQS and the second strobe signal DQSB is used in advance to drive the input data. For example, the data alignment circuit 2080 may align the output signal of the first buffer 2032 in advance at the rising timing of the first strobe signal DQS or align the output signal of the first buffer 2032 in advance at the rising timing of the second strobe signal DQSB in response to the phase information signal PD_INFO, thereby outputting the aligned signal as the input data DATA_IN.

As is apparent from the above descriptions, a semiconductor device that performs a write leveling operation in accordance with one or more embodiments of the present invention may use one shared clock generation circuit and one shared transmission path for a write operation and the write leveling operation so that a CLK-to-DQS skew may be minimized and tDQSS characteristics may be improved.

In addition, a semiconductor device that performs a write leveling operation in accordance with one or more embodiments of the present invention may use one shared clock generation circuit and one shared transmission path for a write operation and the write leveling operation so that the circuit occupying area and the number of signal transmission lines may be reduced.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Also, dispositions and types of the logic gates and transistors described in the aforementioned embodiments may be implemented differently based on the polarity of the inputted signal.

What is claimed is:

1. A semiconductor device comprising:
a clock generation circuit suitable for generating first and second write clocks that correspond respectively to a rising clock and a falling clock of an external clock during a write leveling operation, and for generating an input clock based on a delay of a write command by a delay time based on the rising clock during a write operation, wherein the first write clock and the second write clock have a phase difference of approximately 90 degrees during the write leveling operation, and the input clock has substantially the same pulse width as an activation period of the rising clock during the write operation;
a first transmission line suitable for transmitting the first write clock or the input clock as a first transmission clock; and
a second transmission line suitable for transmitting the second write clock as a second transmission clock.

2. The semiconductor device of claim 1, wherein the clock generation circuit includes:
a first clock generation block suitable for generating the first write clock based on a buffering operation of the rising clock during the write leveling operation and for generating the input clock based on the delay of the write command by the delay time based on the rising clock during the write operation; and
a second clock generation block suitable for generating the second write clock based on a buffering operation of the falling clock during the write leveling operation.

3. The semiconductor device of claim 2, wherein the first clock generation block includes:
an input latch unit suitable for latching the write command to output as an input comparison signal in response to a falling edge of the rising clock; and
a clock combination unit suitable for outputting as the first write clock based on a buffering operation of the rising clock when a mode control signal is activated and for outputting the rising clock as the input clock during a specific period of the input comparison signal when the mode control signal is deactivated.

4. The semiconductor device of claim 3, wherein the mode control signal is an output signal of a mode register set that is activated during the write leveling operation and is deactivated during the write operation.

5. The semiconductor device of claim 2, wherein the second clock generation block outputs as the second write clock based on the buffering operation of the falling clock when the mode control signal is activated and outputs an output terminal fixed with a specific level when the mode control signal is deactivated.

6. The semiconductor device of claim 1, further comprising:
a write control circuit suitable for generating a leveling control signal during the write leveling operation and a phase information signal during the write operation based on the first and second transmission clocks, a first strobe signal, and a second strobe signal a phase of which is opposite to a phase of the first strobe signal.

7. The semiconductor device of claim 6, wherein the leveling control signal has information on a phase difference between the external clock and the first and second strobe signals, and the phase information signal has information on which of the first strobe signal and the second strobe signal is used in advance to drive an input data.

8. The semiconductor device of claim 6, wherein the write control circuit includes:
a first comparison circuit suitable for outputting the first transmission clock as a first comparison signal in response to a rising edge of the first strobe signal;
a second comparison circuit suitable for outputting the first transmission clock as a second comparison signal in response to a rising edge of the second strobe signal;
a third comparison circuit suitable for outputting the second transmission clock as a third comparison signal in response to the rising edge of the first strobe signal;
a fourth comparison circuit suitable for outputting the second transmission clock as a fourth comparison signal in response to the rising edge of the second strobe signal;
a write leveling control block suitable for generating the leveling control signal based on a driving operation of the first to fourth comparison signals based on the mode control signal; and
a write operation control block suitable for generating the phase information signal based on the driving operation of the first and second comparison signal based on the mode control signal.

9. The semiconductor device of claim 8, wherein the write leveling control block determines whether the first and third comparison signals have the same level or whether the second and fourth comparison signals have the same level to generate the leveling control signal when the mode control signal is activated.

10. The semiconductor device of claim 8, wherein the write leveling control block includes:
a first driving unit suitable for driving a first common node based on the first comparison signal;
a second driving unit suitable for driving the first common node based on the second comparison signal;
a third driving unit suitable for driving a second common node based on the third comparison signal;
a fourth driving unit suitable for driving the second common node based on the fourth comparison signal; and
a determining unit suitable for determining whether voltages of the first and second common nodes are the same or different to generate the leveling control signal when the mode control signal is activated.

11. The semiconductor device of claim 8, wherein the write operation control block activates the phase information signal when the first comparison signal has a specific level and deactivates the phase information signal when the second comparison signal has the specific level when the mode control signal is deactivated.

12. The semiconductor device of claim 8, wherein the write operation control block includes:
a first driver suitable for inverting and driving a first node based on the first comparison signal;
a second driver suitable for inverting and driving a second node based on the second comparison signal; and
an information output unit suitable for activating the phase information signal based on a voltage of the first node and deactivating the phase information signal based on a voltage of the second node when the mode control signal is deactivated.

13. An operating method of a semiconductor device, comprising:
  generating first and second write clocks that correspond respectively to a rising clock and a falling clock of an external clock and transmitting the first and second write clocks respectively to first and second transmission lines during a write leveling operation;
  generating a leveling control signal based on the first and second write clocks transmitted respectively to the first and second transmission lines and first and second strobe signals during the write leveling operation, wherein during the write leveling operation, the first write clock and the second write clock have a phase difference of approximately 90 degrees;
  generating an input clock by delaying a write command by a set time and transmitting the input clock to the first transmission line based on the rising lock during a write operation wherein during the write operation, the input clock has substantially the same pulse width as an activation period of the rising clock; and
  generating a phase information signal based on the input clock transmitted to the first transmission line and the first and second strobe signals during the write operation.

14. The operating method of claim 13, wherein during the write leveling operation, phases of the first strobe signal and the second strobe signal are opposite to each other.

15. The operating method of claim 13, wherein during the write operation, phases of the first strobe signal and the second strobe signal are opposite to each other.

16. The operating method of claim 13, wherein the leveling control signal has information on a phase difference between the external clock and the first and second strobe signals, and
  the phase information signal has information on which of the first strobe signal and the second strobe signal is used in advance to drive an input data.

17. The operating method of claim 13, wherein the generating of the first and second write clocks during the write leveling operation includes:
  outputting the first write clock by buffering the rising clock and outputting the second write clock by buffering the falling clock.

18. The operating method of claim 13, wherein the generating of the leveling control signal during the write leveling operation includes:
  outputting the first write clock as a first comparison signal in response to a rising edge of the first strobe signal;
  outputting the first write clock as a second comparison signal in response to a rising edge of the second strobe signal;
  outputting the second write clock as a third comparison signal in response to the rising edge of the first strobe signal;
  outputting the second write clock as a fourth comparison signal in response to the rising edge of the second strobe signal; and
  generating the leveling control signal by determining whether the first and third comparison signals have the same level or whether the second and fourth comparison signals have the same level.

19. The operating method of claim 13, wherein the generating of the input clock during the write operation includes:
  outputting an input comparison signal by latching the write command in response to a falling edge of the rising clock; and
  outputting the rising clock as the input clock during a specific period of the input comparison signal.

20. The operating method of claim 13, wherein the generating of the phase information signal during the write operation includes:
  outputting the input clock as a first comparison signal in response to a rising edge of the first strobe signal;
  outputting the input clock as a second comparison signal in response to a rising edge of the second strobe signal; and
  activating the phase information signal when the first comparison signal has a specific level and deactivating the phase information signal when the second comparison signal has the specific level.

21. A semiconductor device comprising:
  a clock generation circuit suitable for generating first and second clocks that correspond respectively to a rising clock and a falling clock of an external clock when a mode control signal is activated and for generating a third clock based on a delay of an input command by a set time based on the rising clock when the mode control signal is deactivated, wherein the first clock and the second clock have a phase difference of approximately 90 degrees when the mode control signal is activated, and the third clock has substantially the same pulse width as an activation period of the rising clock when the mode control signal is deactivated;
  a signal transmission block suitable for transmitting the first and third clocks as a first transmission clock and transmitting the second clock as a second transmission clock; and
  an internal circuit suitable for receiving the first and second transmission clocks and first and second strobe signals, generating first information on a phase difference between the external clock and the first and second strobe signals when the mode control signal is activated, and generating second information on which of the first and second strobe signals is used in advance to drive an input data when the mode control signal is deactivated.

22. The semiconductor device of claim 21, wherein the mode control signal is an output signal of a mode register set that is activated during a write leveling operation and is deactivated during a write operation.

23. The semiconductor device of claim 21, wherein the clock generation circuit includes:
  an input latch block suitable for latching the input command to output as an input comparison signal in response to a falling edge of the rising clock;
  a first clock output block suitable for outputting as the first clock based on a buffering operation of the rising clock when the mode control signal is activated and outputting the rising clock as the third clock during a specific period of the input comparison signal when the mode control signal is deactivated; and
  a second clock output block suitable for outputting as the second clock based on a buffering operation of the falling clock when the mode control signal is activated and outputting an output terminal fixed with a specific level when the mode control signal is deactivated.

* * * * *